United States Patent [19]

Lamont, Jr.

[11] Patent Number: 4,673,480

[45] Date of Patent: Jun. 16, 1987

[54] MAGNETICALLY ENHANCED SPUTTER SOURCE

[75] Inventor: Lawrence T. Lamont, Jr., Mountain View, Calif.

[73] Assignee: Varian Associates, Inc., Palo Alto, Calif.

[21] Appl. No.: 575,111

[22] Filed: Jan. 30, 1984

Related U.S. Application Data

[62] Division of Ser. No. 150,532, May 16, 1980, Pat. No. 4,457,825.

[51] Int. Cl.$^4$ ............................................. C23C 14/36
[52] U.S. Cl. ................................. 204/298; 204/192.12
[58] Field of Search ........................... 204/192 R, 298

[56] References Cited

U.S. PATENT DOCUMENTS

| | | | |
|---|---|---|---|
| 3,282,815 | 11/1966 | Kay et al. | 204/192 |
| 3,616,450 | 10/1971 | Clark | 204/298 |
| 3,711,398 | 1/1973 | Clark | 204/298 |
| 3,829,373 | 8/1974 | Kuehnle | 204/298 |
| 3,878,085 | 4/1975 | Corbani | 204/298 |
| 4,046,660 | 9/1977 | Fraser | 204/192 C |
| 4,060,470 | 11/1977 | Clarke | 204/192 R |
| 4,100,055 | 7/1978 | Rainey | 204/298 |
| 4,155,825 | 5/1979 | Fournier | 204/192 R |
| 4,162,954 | 7/1979 | Morrison, Jr. | 204/298 |
| 4,166,783 | 9/1979 | Turner | 204/192 R |
| 4,180,450 | 12/1979 | Morrison, Jr. | 204/298 |
| 4,198,283 | 4/1980 | Class et al. | 204/298 |
| 4,204,936 | 5/1980 | Hartsough | 204/192 R |
| 4,239,611 | 12/1980 | Morrison, Jr. | 204/298 |
| 4,265,729 | 5/1981 | Morrison, Jr. | 204/298 |
| 4,282,083 | 8/1981 | Kertesz et al. | 204/298 |
| 4,404,077 | 9/1983 | Fournier | 204/192 R |

OTHER PUBLICATIONS

J. L. Vossen & J. J. Cuomo, "Glow Discharge Sputter Deposition", in Thin Film Processes, (J. L. Vossen & W. Kern, eds.), Ch II-1, pp. 11-73, Academic Press, New York, 1978.

J. A. Thornton & A. S. Penfold, "Cylindrical Magnetron Sputtering", in Thin Film Processes, (J. L. Vossen & W. Kern, eds.), Ch II-2, pp. 75-113, Academic Press, New York, 1978.

(List continued on next page.)

Primary Examiner—John F. Niebling
Assistant Examiner—William T. Leader
Attorney, Agent, or Firm—Stanley Z. Cole; Gerald M. Fisher; Kenneth L. Warsh

[57] ABSTRACT

A circular magnetron sputter source employs a central anode surrounded by an annular cathode of generally inverted conical configuration. The anode structure forms a composite anode and inner magnetic pole piece which is operated at or near ground potential. An outer magnetic pole piece concentrically surrounds the annular cathode. This outer pole piece is electrically isolated from the cathode, and held at or near ground potential. The cathode is operated at a potential of several hundred volts negative with respect to ground. The cathode is held in place by a novel retainer means and has a novel cross section configuration. Magnetic flux is provided either by permanent magnets or by electromagnets or by a combination of both located externally of the vacuum chamber in which the sputter source is operated. Magnetic field lines pass from the outer pole piece and through the cathode, exiting the sputter surface near the outer edge of the cathode. These magnetic field lines form an arch over the cathode by passing directly to the central anode without reentering the uneroded sputter surface of the cathode. In a circular geometry, these arching magnetic field lines form an endless tunnel for confining a glow discharge. The tunnel thus formed is a novel and modified magnetic tunnel in which electrons are reflected electrostatically from the cathode surface near the outer edge of the cathode and reflected by magnetic mirroring near the inner edge. Use of this modified magnetic tunnel leads to improved electrical impedance characteristics of the glow discharge and to improved uniformity in cathode erosion.

24 Claims, 11 Drawing Figures

OTHER PUBLICATIONS

D. B. Fraser, "The Sputter & S-Gun Magnetrons", in Thin Film Processes, (J. L. Vossen & W. Kern, eds.), Ch II-3, pp. 115–129, Academic Press, New York, 1978.

R. K. Waits, "Planar Magnetron Sputtering", in Thin Film Processes, (J. L. Vossen & W. Kern, eds.), Ch II-4, pp. 131–173, Academic Press, New York, 1978.

J. D. Jackson, "Classical Electrodynamics", pp. 419–424, John Wiley & Sons, New York, 1962.

N. A. Kroll & A. W. Trivelpiece, "Principles of Plasma Physics", pp. 622–623, McGraw Hill Book Co., New York, 1973.

F. F. Chen, "Introduction to Plasma Physics", pp. 23–31, Plenum Press, New York, 1974.

J. R. Mullaly, "A Crossed Field Discharge Device for High Rate Sputtering", Dow Chemical Co., 1969, U.S. AEC Contract AT(29-1)-1106.

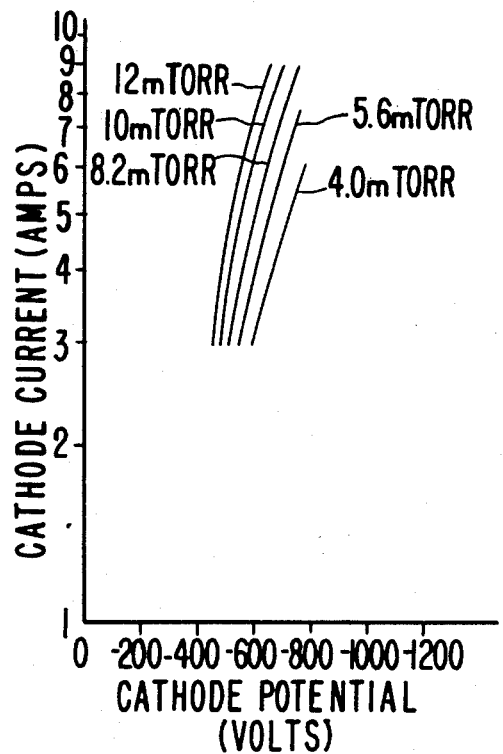
FIG.6a
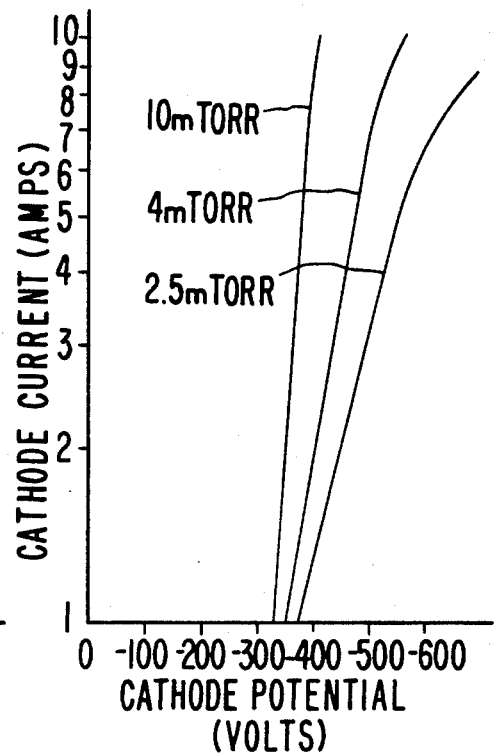
FIG.6b
PRIOR ART
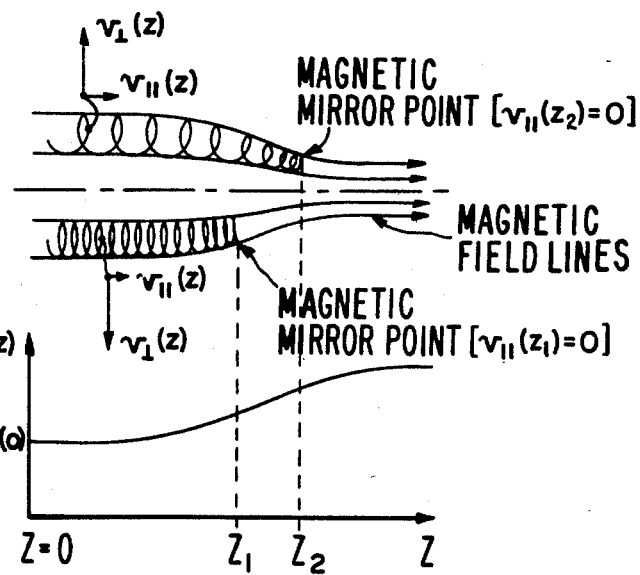
FIG.7a
FIG.7b

MAGNETICALLY ENHANCED SPUTTER SOURCE

This application is a division of application Ser. No. 150,532, filed 05/16/80 now U.S. Pat. No. 4,457,825.

FIELD OF THE INVENTION

This invention is in the field of vaccum sputter coating apparatus and particularly relates to a magnetron sputter source for such apparatus.

BACKGROUND OF THE INVENTION

Vacuum deposition of coatings is in widespread use today, and appears to be of growing importance in the future. Cathode sputtering induced by glow discharges is emerging as one of the more important processes for effecting such depositions. Much of the recent work relates to various magnetron geometries in which enhanced sputtering rates and operation at lower pressures are achieved through judicious use of magnetic fields. An extensive literature has developed and many patents have issued over the past decade. A particularly informative and reasonably current summary is contained in the book "Thin Film Processes" edited by John L. Vossen and Werner Kern, published by Academic Press, New York, 1978. Particularly relevant chapters are: Chapter II-1, "Glow Discharge Sputter Deposition", by J. L. Vossen and J. J. Cuomo; Chapter II-2, "Cylindrical Magnetron Sputtering", by John A. Thornton and Alan S. Penfold; Chapter II-3, "The Sputter and S-Gun Magnetrons", by David B. Fraser; and Chapter II-4, "Planar Magnetron Sputtering" by Robert K. Waits.

In order for the intensity of glow discharges to be enhanced through the application of magnetic fields, it is necessary that electrode geometries, magnetic field intensities, and magnetic field geometries be selected in such a way as to produce electron traps. In most cases, crossed electric and magnetic fields give rise to electron drift currents which close on themselves. In the case of cylindrical magnetrons, for example, radial electron traps can be formed with essentially uniform magnetic fields parallel to the axes of the cathode and anode cylinders. By providing the cathode with electron reflecting surfaces at its ends, loss of electrons from the discharge through axial drift can be reduced, thus further enhancing the discharge intensity, and making operation at lower gas pressures possible. (See, for example, above-referenced Chapter II-2, "Cylindrical Magnetron Sputtering", by John A. Thornton and Alan S. Penfold, especially pp. 77-88.)

In many of the magnetrons employed commercially for sputter deposition, electron trapping is accomplished by shaping the magnetic field relative to the shape of the sputter target (cathode). In particular, most planar magnetrons employ a magnetic field which loops through the planar cathode surface and which forms a tunnel-shaped magnetic field which closes on itself. (See, for example, above-referenced Chapter II-4, "Planar Magnetron Sputtering", by Robert K. Waits, especially page 132.) Under normal operating conditions, the glow discharge is largely confined to this magnetic tunnel.

Magnetic tunnels are also employed with non-planar magnetron configurations. An example of a hollow cathode cylindrical magnetron employing a single magnetic tunnel is shown in FIG. 4, p. 118 of above-referenced Chapter II-3, "The Sputter and S-Gun Magnetrons", by David B. Fraser. In addition, examples of cylindrical magnetrons employing multiple magnetic tunnels are shown in FIG. 3., p. 78 of above-referenced Chapter II-2.

Another circular magnetron sputter source in commercial use employs a cathode (target) of a generally inverted conical configuration surrounding an axially symmetric central anode. An example of such a sputter source may be found described in more detail in U.S. Pat. No. 4,100,055, issued July 11, 1978 to Robert M. Rainey and entitled "Target Profile for Sputtering Apparatus" and assigned to the assignee of the present invention. Such a sputter source is also commercially available from and manufactured by Varian Associates, Inc. under the trademark "S-Gun". This type of sputter source is also described, for example, in above-referenced Chapter II-3, especially FIG. 1, p. 116 and FIG. 3, p. 117. In particular, FIG. 3, p. 117 shows schematically the magnetic field looping through the conical cathode (target) surface to form a magnetic tunnel which confines the glow discharge.

In prior art magnetic tunnels, the energetic electrons which sustain the glow discharge would need to cross magnetic field lines to escape from the magnetic tunnel, which they are unable to do if the magnetic field intensities are great enough. Also, those electrons which have been captured into the discharge are energetically incapable of reaching the cathode. Thus, even though these electrons may follow magnetic field lines toward the cathode surface, they will be electrostatically reflected from the cathode surface back into the discharge.

If the magnetic field intensity falls off with distance from the cathode surface, as it does in most prior art magnetic tunnels, "magnetic mirroring" can also contribute to electron reflection. The main effect of such magnetic mirroring is, on average, to move the region of electron reflection a bit further from the cathode surface. This effect is incidental rather than crucial to the magnetic tunnel's role in reflecting electrons in order to contain the glow discharge. In any event, those electrons which would otherwise escape through the magnetic mirror will be reflected electrostatically back into the discharge. It is therefore both convenient and proper to refer to the electron reflection in the prior art simply as "electrostatic", even though some magnetic mirroring may be occurring.

Discharge intensity tends to be a maximum in the center of a magnetic tunnel, where the magnetic field lines are generally parallel to the cathode surface, and falls off rapidly as the sides of the magnetic tunnel are approached. Localized cathode (target) erosion rates correspond generally with the immediately adjacent intensity of the glow discharge, thus leading to nonuniform erosion of the cathode surface. Examples of nonuniform erosion of an S-Gun cathode are shown in FIG. 3 of above-referenced U.S. Pat. No. 4,100,055 to Rainey, and examples in the case of planar magnetron cathodes are shown in FIG. 5, p. 141 of above-referenced Chapter II-4.

One consequence of nonuniform cathode erosion is that there is less-than-maximum utilization of target material. Another consequence of nonuniform cathode erosion is that changes may occur in the distribution pattern of sputtered material leaving the cathode surface. Additionally, the glow discharge tends to move downward in the magnetic tunnel to maintain close proximity to the cathode surface as the cathode surface erodes away. This movement when coupled with nonuniform cathode erosion tends to concentrate the discharge even more sharply, leading to still greater nonuniformity of cathode erosion. Furthermore, such nonuniform cathode erosion restricts the area of emission of sputtered atoms to a relatively narrow band on the cathode surface. This in turn restricts the range of direction of sputtered atoms arriving at the substrate to be coated, thus affecting such film properties as uniformity and step coverage, both of which are of particular importance in metalization of semiconductor wafers, for example. Also, the deposition rate from a deeply eroded cathode may be reduced because of geometrical shielding effects. In addition, nonuniform cathode erosion is attended by correspondingly nonuniform cathode heating, which contributes adversely both to cathode cooling problems and to thermal stressing of the cathode.

Using prior art magnetic tunnels, a further consequence of the movement of the glow discharge with erosion of the cathode surface is that the discharge generally moves into a region of greater magnetic field intensity. This results in a lowering of the discharge impedance, which requires lower operating voltage, higher dishcarge current, and higher discharge power to maintain a fixed deposition rate (see above-referenced Chapter II-2, pp. 94–98; also see above-referenced Chapter II-3, pp. 117–121). An indication of the severity of this problem in some applications is conveyed by U.S. Pat. No. 4,166,783 issued Sept. 4, 1979 to Frederick T. Turner and entitled "Deposition Rate Regulation by Computer Control of Sputtering Systems" and assigned to the assignee of the present invention.

Accordingly, it is an object of the invention to provide a glow discharge sputter source in which input power can be maintained constant throughout cathode (target) life for constant deposition rate.

Another object of the invention is to provide a sputter source which operates with higher sputtering efficiency, whereby power consumption and power supply size are reduced.

Another object of the invention is to provide a sputter source in which the electrical impedance of the glow discharge remains substantially constant throughout cathode (target) life, whereby the problems of supplying and controlling power are reduced.

A further object of the invention is to increase the utilization of target material, thereby increasing target life.

Yet another object of the invention is to maintain a more uniform distribution pattern of sputtered material leaving the cathode surface over the useful life of the cathode.

A further object of the invention is to increase the width of the band from which sputtered atoms are emitted from the cathode, whereby coatings having improved properties may be obtained.

A still further object of the invention is to ease the cathode cooling problem, thereby allowing operation at higher powers and at correspondingly greater sputter deposition rates.

Yet another object of the invention is to reduce thermal stressing of the cathode, whereby fracture, localized melting, and the like are avoided.

A further object of the invention is to provide an improved means for holding the cathode in place, whereby brittle and weak cathodes may be retained without breakage caused by the holding means.

A still further object is to reduce the amount of unused target material in the cathode.

SUMMARY OF THE INVENTION

In prior art magnetic tunnels as applied to sputter sources, the magnetic field loops through the cathode surface to confine the glow discharge within the magnetic tunnel. As discussed earlier, confinement of the discharge occurs because electrons are reflected electrostatically from the cathode surface back into the discharge. Such electrostatic reflection takes place on "both sides" of the magnetic tunnel.

In the preferred embodiment of the present invention, a modified magnetic tunnel is employed in which only a "first side" of the magnetic tunnel passes through the cathode surface. Confinement of the glow discharge on the "second side" is provided by a "magnetic mirror". Electron reflection thus occurs electrostatically from the cathode surface on the first side of the magnetic tunnel, whereas electrons are reflected by magnetic mirroring on the second side.

One feature of magnetic mirrors which is of particular importance in the present invention is that the mirrors are "soft" in the sense that the point of reflection is not a well defined physical surface, but depends on the ratio of parallel to perpendicular electron velocities relative to the direction of the magnetic field at some interior point. This "softness" of the magnetic mirrors is used to advantage in the present invention to produce a widening and a spreading out of the discharge toward the "magnetic mirror side" of the discharge. This contributes to a broader, less sharply concentrated cathode erosion pattern.

One consequence of using one or more magnetic mirrors is that it becomes possible to design magnetic tunnels which are much flatter, that is, much less sharply arching, than the prior art magnetic tunnels. This contributes to increased uniformity of cathode erosion, and can lead also to glow discharges whose electrical impedance at a fixed power level and operating pressure remains more constant as the cathode is eroded away. In certain applications this means that a much simpler control system can be used to obtain the desired deposition rate than has been possible heretofore with sputter sources employing prior art magnetic tunnels. It also means that less flexibility is required of the power supply, which leads to reductions in size and cost as compared with the power supplies required for prior art sputter sources employing magnetic tunnels.

Thus it is that the use of a magnetic tunnel employing one or more magentic mirrors allows many of the objects of the present invention to be realized.

BRIEF DESCRIPTION OF THE DRAWINGS

FIGS. 6a and 6b show voltage-current curves with argon pressure as a parameter for the sputter sources of FIGS. 1 and 2 respectively.

FIG. 7a shows schematically magnetic field lines converging to form a magnetic mirror, together with representative electron trajectories.

FIG. 7b shows schematically the relative magnitude of the magnetic field intensity along a representative magnetic field line of FIG. 7a.

DETAILED DESCRIPTION

Figure 1:
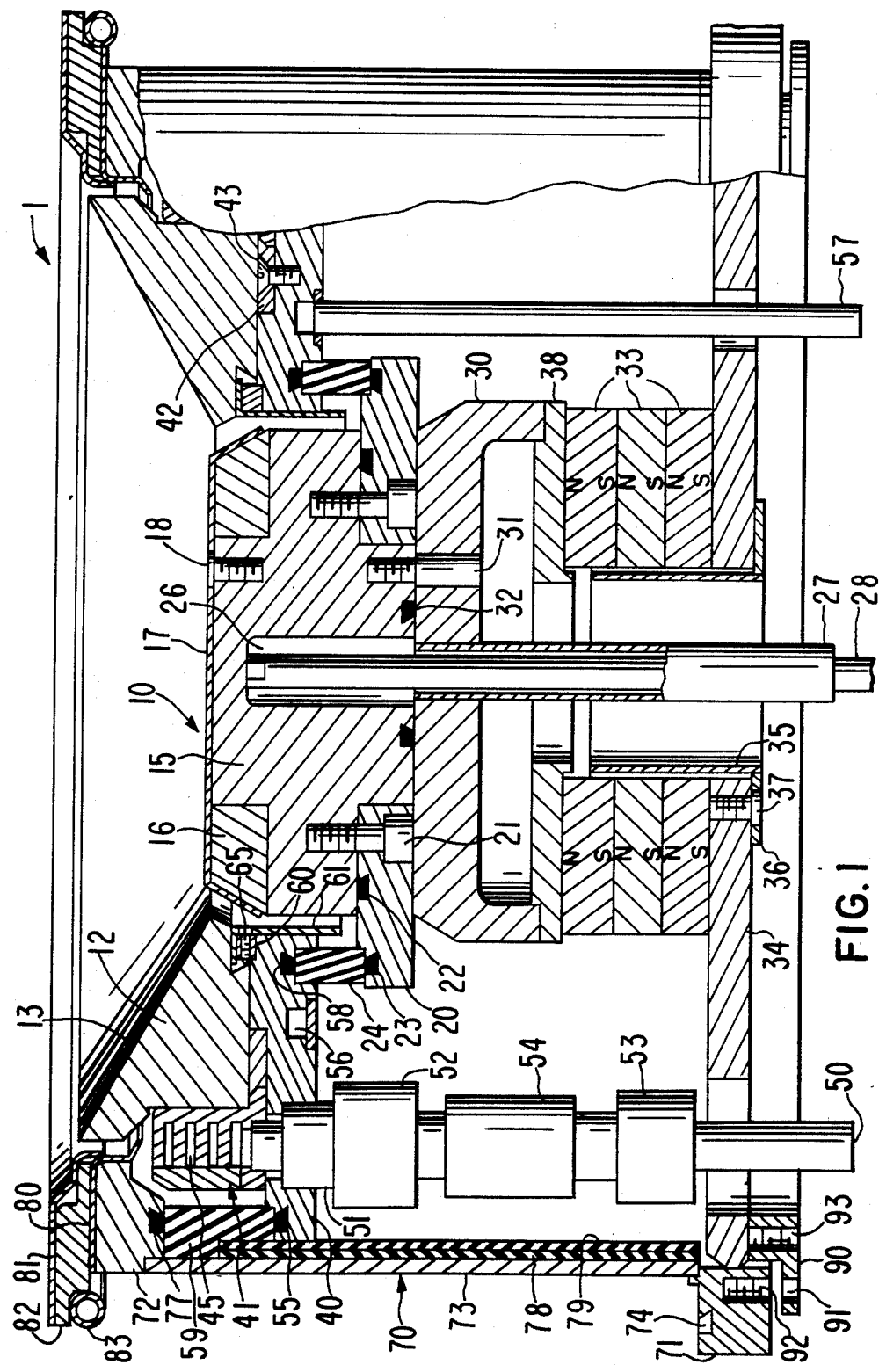
FIG. 1 is a partial section of a sputter source incorporating the present invention in the preferred embodiment.

The preferred embodiment of the present invention is shown in FIG. 1 wherein the sputter coating source 1 is of generally circular configuration. A circular central anode 10 is surrounded by a circular cathode ring 12 having a front sputter surface 13 of generally inverted conical configuration from which material is to be sputtered. The ring member 12 is at negative potential relative to anode 10 during operation of the sputter coating source and thus is aptly termed a cathode. Ring member 12 also forms a target for bombardment by ions from the glow discharge and thus is also referred to in the art as a sputter target. Accordingly, ring 12 is referred to in various places in the description and claims alternatively as a cathode or a sputter target. The details of the cross sectional shape of the cathode (sputter target) 12 will be described hereinafter in respect to FIG. 8.

Anode 10 serves both as an electrical field forming electrode and as one end of the magnetic field-forming circuit. More specifically, anode 10 comprises a magnetic pole piece 15, and in order to facilitate insertion and removal of the cathode (as will be hereinafter described in detail), pole piece 15 preferably includes a removable annular ring portion 16. Also, a removable thin anode surface sheet in the form of inverted cup 17 is held in place by screws 18 (one shown). Anode surface sheet 17 can be magnetic or nonmagnetic material, but if nonmagnetic, it should be sufficiently thin to preserve the desired magnetic field strength at the anode surface. An annular member 20, made of nonmagnetic material, is attached by means of bolts 21 to pole piece 15. An inner O-ring groove 22 allows a vacuum tight seal to be made between annular member 20 and pole piece 15. Annular member 20 also contains outer O-ring groove 23 for sealing to the lower side of an electrical insulator ring 24 to insulate anode 10 from cathode 12. Anode 10 including pole piece 15 is cooled by passing coolant through a water channel 26 via coaxial conduits 27 and 28. An inverted cup-shaped magnetic member 30 is secured to pole piece 15 by means of bolts 31 (one shown). An O-ring groove 32 is provided in pole piece 15 to prevent coolant leakage between pole piece 15 and magnetic member 30. Annular magnets 33 provide the magnetic field for the magnetically enhanced sputter source. Because magnets 33 are located outside of the vacuum chamber, they need not be made of vacuum-compatible materials. Thus, for example, magnets 33 may be made of a barium ferrite permanent magnet material such as Indox 5. Alternatively, an annular electromagnet (not shown) may be used in combination with permanent magnets 33 to provide an electrically controllable portion of the magnetic field. Such electrical control of the magnetic field can be used to adjust the electrical impedance of the glow discharge, whereby, for example, changes in discharge impedance with cathode erosion can be compensated. In addition, a temporary increase in magnetic field can be advantageously used to trigger discharge initiation. Magnets 33 are placed on a magnetic base plate 34, onto which they are held by magnetic attraction. Adequate centering of magnets 33 is achieved through the use of a nonmagnetic cylinder 35 secured to flange 36, which is secured in turn to base plate 34 by screws 37 (one shown). A magnetic ring 38 is placed between magnetic member 30 and upper magnet 33. Magnetic members 30 and 38 and magnets 33 are held together by magnetic attraction.

Cathode 12 is secured, by novel means which are detailed later, to a nonmagnetic annular base member 40. Cathode 12 is also surrounded by nonmagnetic water jacket 41. Cathode 12 and water jacket 41 are so dimensioned that room temperature clearance between these members is large enough to allow easy installation and removal, yet small enough to provide adequate thermal contact for cathode cooling when the cathode expands upon heating during normal operation. Water jacket 41 is secured mechanically to base member 40 by means of a nonmagnetic ring member 42 held by screws 43 (one shown). Water jacket 41 has internal water channels 45 through which coolant, preferably water, is circulated via conduits 50 (one shown). Conduits 50 are brazed in sleeves 51 which are brazed in base member 40 to provide vacuum-tight sealing between conduits 50 and base member 40. Conduits 50 also comprise conventional detachable compression fittings 52 and 53 plus a bellows member 54, which is employed to reduce mechanical stress on the vacuum-tight sealing of conduits 50 to base member 40. Direct cooling of base member 40 is provided by water channel 56 through which coolant is circulated via conduits 57 (one shown). This cooling is of particular importance in preserving the vacuum integrity of the O-ring in an O-ring sealing groove 58 for sealing the upper side of anode insulator 24. Base member 40 also contains an O-ring sealing groove 55 for sealing to the lower side of an electrical insulator ring 59 for the cathode. Finally, base member 40 has secured to it, by tack welding for example, a cathode retainer ring 60 which is shown in greater detail in FIG. 8. A shield ring 61 has an outer lip portion which is sandwiched between the top of retainer ring 60 and cathode 12. The purpose of shield 61 is to reduce undesired coating of anode insulator 24 during sputter source operation. Retainer ring 60 contains a plurality of threaded holes, and shield 61 contains a plurality of corresponding clearance holes which are brought into registry during assembly.

Figure 8:
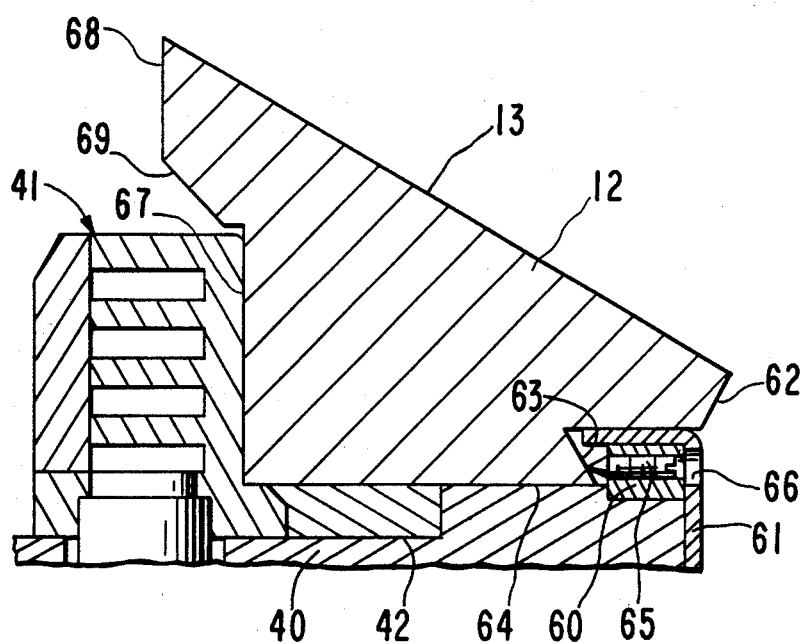
FIG. 8 is a fragmentary section of the sputter source of FIG. 1 showing in greater detail the cathode retaining means.

As shown in greater detail in FIG. 8, cathode 12 contains an inner rim portion 62 including an annular groove having angled wall 63 which makes an acute angle of about 60° with the bottom or back surface 64 of cathode 12. The threaded holes in retaining ring 60 engage threaded members 65, which may be dog-point set screws, for example, or, alternatively, special screws incorporating spring-loaded ball plungers. Tightening threaded members 65 against angled wall 63 by inserting a tool through holes 66 in shield ring 61 provides positive retention of cathode 12 upon normal installation at room temperature. The number of threaded members 65 employed is preferably three. When cathode 12 expands upon heating during normal operation, it may expand away from threaded members 65. However, acutely angled wall 63 in cooperation with threaded members 65 serve to prevent cathode 12 from falling a significant distance away from base member 40 in case the sputter source is operated in an inverted position, for example. Moreover, thermal expansion of cathode 12 during normal operation tends to hold it securely in water jacket 41. Replacement of cathode 12 is accomplished by removing anode surface sheet 17 and annular ring portion 16 from pole piece 15, and then unscrewing threaded members 65 enough to release the cathode, which in turn releases shield ring 61 which is simply held in place by the presence of cathode 12.

As shown in detail in FIG. 8, cathode 12 has an outer surface or rim formed by a lower portion 67 and an upper surface portion 68 of larger diameter than the lower portion 67. The upper and lower portions are preferably joined by a sloping intermediate portion 69. The relative shaping and positioning of inner pole piece 15 and the hereinafter described outer pole piece 72 cooperates with the above-described shaping of the cathode 12 to obtain the desired magnetic field shape with respect to cathode 12. These relationships and resulting erosion pattern have also been found to permit the direct cooling of cathode 12 to be limited to the area of lower wall portion 67, as distinguished from having the outer surface of the cathode extend straight down from the large diameter outer portion 68. Thus the cathode shape in FIGS. 1 and 8 results in a smaller overall diameter for the sputter source 1 with attendant savings in cost of materials and space occupied by the source. The above relationships also result in the thick inner rim 62 on cathode 12 which permits use of the novel angled wall 63 and threaded members 65 for holding the cathode in place.

A housing 70 for the anode-cathode assembly comprises a lower ring member 71 and an outer magnetic pole piece ring 72 joined together in vacuum-tight fashion by a cylindrical wall member 73. Members 71 and 73 are made of ferromagnetic material, such as cold rolled steel, to provide portions of the required magnetic path to pole piece 72. Lower ring member 71 contains O-ring sealing groove 74 to facilitate demountable and vacuum-tight installation of the sputter source of FIG. 1 in the wall of the vacuum chamber (not shown) so that the sputter source projects from the chamber wall into the chamber. Pole piece 72 also contains O-ring sealing groove 77 to allow a vacuum-tight seal to be made to the upper side of cathode insulator 59. A concentric pair of cylindrical flash-over insulators 78 and 79 is provided to prevent arcing to wall member 73 during sputter source operation. Removably attached (attachment means not shown) to outer pole piece 72 are nonmagnetic ground shield members 80 and 81, with water cooled nonmagnetic member 82 positioned between the two ground shields and cooled via water flowing through attached conduit 83. Ground shield 80 serves particularly to reduce undesired coating of cathode insulator 59 during sputter source operation.

The overall assembly of the sputter source of FIG. 1 is held together by means of clamping ring member 90. Bolts (not shown) draw clamping ring member 90 toward lower ring member 71 by passing through hole 91 and engaging threads in hole 92. In so doing, clamping ring member 90 forces base plate 34 upward, thereby effecting vacuum-tight seals by compressing O-rings in O-ring sealing grooves 23 and 58 on the lower and upper sides respectively of anode insulator 24, and also by compressing O-rings in O-ring sealing grooves 55 and 77 on the lower and upper sides respectively of cathode insulator 59.

After the sputter source is installed in the vacuum chamber and the chamber is evacuated, atmospheric pressure acts to compress the just-mentioned O-rings even further, thereby contributing positively to the vacuum integrity of the O-ring seals. This additional compression of the O-rings leads to an upward movement of base plate 34 and, correspondingly, to a reduction in tension of the bolts (not shown) which draw clamping ring member 90 toward lower ring member 71. Such reduction in bolt tension may allow clamping ring member 90 to rattle around loosely, thereby motivating an operator to retighten the bolts. This, if done, could lead to overstressing of the bolts and/or clamping ring member 90 when the vacuum system is let back up to atmospheric pressure. This problem is avoided through the use of special bolts incorporating spring-loaded ball plungers (not shown) screwed into threaded hole 93 in clamping ring member 90. The spring-loaded plungers press against base plate 34, thereby maintaining tension on the bolts (not shown) engaging threaded holes 92 after base plate 34 has moved forward upon vacuum system evacuation.

As will be discussed in greater detail, the objects of the present invention are realized by employing a modified magnetic tunnel in which one side of the magnetic tunnel is formed by a magnetic mirror. Design of the magnetic circuit overall, including particularly the geometries of the center anode pole piece 15 and outer pole piece 72, has led to the pattern of magnetic field lines 95 shown in FIG. 3. It should be noted that the arching magnetic field lines above uneroded cathode sputter surface 13 do not loop through the cathode surface, as they do in many prior art sputter sources. Rather, those magnetic field lines which do pass through cathode sputter surface 13 go directly to anode 10 rather than passing a second time through cathode sputter surface 13. It will be established subsequently that electron reflection from anode 10 back into the glow discharge occurs due to magnetic mirroring with this particular magnetic field configuration.

In typical operation, the chamber in which the sputter source is mounted is evacuated to a pressure on the order of $10^{-6}$ Torr. The chamber is then back-filled with a sputter gas, which is typically argon, to a pressure in the range of 0.1 to 100 mTorr. Ground shields 80 and 81 and anode 10 are normally held at ground potential (although anode 10 may be biased slightly above ground potential in some applications), and a potential in the range $-350$ volts to $-1,000$ volts with respect to ground is applied to cathode 12, depending on such details as anode and cathode geometry, magnetic field intensities, cathode material, sputter gas species, sputter gas pressure, and desired discharge current. By way of example, electrical connection to cathode 12 may be made by a connection to cooling conduit 50, and electrical connection to anode 10 may be made by a connection to cooling conduit 27.

It may be noted that inner magnetic pole 15 is part of anode 10, which is operated at or near ground potential. Outer magnetic pole piece 72 is electrically isolated from cathode 12, and is held at or near ground potential also. Because cathode 12 is operated at a potential of several hundred volts negative with respect to ground, ion bombardment of the pole pieces with attendant sputtering cannot occur. Thus the possibility of contamination of sputter-deposited coatings due to pole piece sputtering is avoided.

Figure 2:
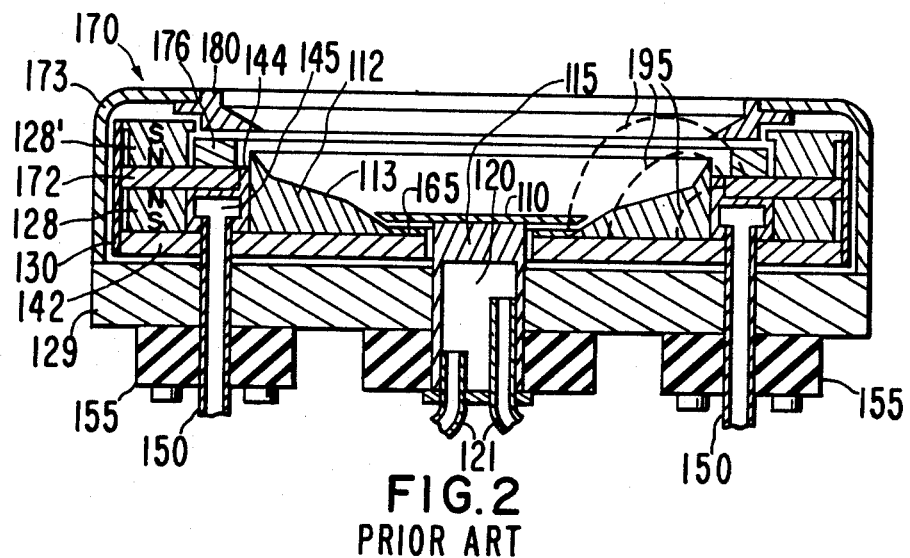
FIG. 2 is a section of a prior art sputter source.

Shown in FIG. 2 is a prior art sputter source of cylindrically symmetric geometry manufactured and sold by Varian Associates, Inc. under the trademark "S-Gun". The S-gun sputter source is described in above-referenced Chapter II-3, especially FIG. 1, page 116 and FIG. 3, page 117. Descriptions in greater detail are provided by aforementioned U.S. Pat. No. 4,100,055 to Rainey, and also by U.S. Pat. No. 4,060,470 to Peter J. Clarke.

In FIG. 2, a central anode 110 is made of nonmagnetic material, such as copper, and is surrounded by an annular cathode 112. Anode 110 is mounted on anode post 115, which is nonmagnetic and is preferably made of copper. Anode post 115 has internal cooling cavity 120 through which water circulates via conduits 121. Anode post 115 is mounted, either conductively or insulatively, on nonmagnetic base plate 129 by means of flange 123.

Cathode 112 has a sputter surface 113 of generally inverted conical configuration. Cathode 112 is mounted on lower magnetic pole piece 142, and is surrounded by nonmagnetic water jacket 144. Clamping ring 165 is optionally provided to secure cathode 112 to pole piece 142. Cathode 112 and water jacket 144 are so dimensioned that room temperature clearance between them is sufficient to allow easy installation and removal of the cathode, yet small enough to provide adequate thermal contact for cathode cooling when the cathode expands upon being heated during normal operation. Water jacket 144 has internal water channel 145 through which coolant, preferably water, is circulated via conduits 150. Conduits 150 are secured to base plate 129 by means of flanges 155. Electrical isolation between base plate 129 and conduits 150 is achieved by making conduits 150 of electrically nonconducting materials. Additional support means (not shown) are employed to ensure that the desired spacing between lower pole piece 142 and base plate 129 is maintained.

The main magnetic field for this prior art magnetically enhanced sputter source is provided by a first plurality of bar magnets 128 (made, for example, of a vacuum-compatible permanent magnet material such as Alnico 8) arrayed annularly between lower magnetic pole piece 142 and an upper magnetic pole piece 172. A second plurality of bar magnets 128' is arrayed annularly above upper pole piece 172 and in magnetic opposition (or in bucking magnetic field arrangement) to the main magnetic field. The principal purpose of the bucking magnetic field arrangement is to suppress stray glow discharges in the region above the upper pole piece 172. A nonmagnetic cylinder 130 defines the outer limits for accurately locating the magnets 128 and 128' with respect to pole pieces 142 and 172, and nonmagnetic ring 176 serves to further suppress stray glow discharges above pole piece 172. The resulting magnetic field lines 195 are shown best in FIG. 4. Of particular interest are those magnetic field lines which arch above and through the sputter surface 113 of cathode 112 to form a magnetic tunnel for confining the glow discharge.

Further, surrounding cathode 112, but electrically isolated therefrom, is a generally cylindrical and nonmagnetic outer housing 170 comprising outer ground shield member 173 conductively attached to base plate 129, and separable inner ground shield member 180.

In general terms, operation of this prior art sputter source of FIG. 2 is similar to that described above for the sputter source of FIG. 1. The significant differences between the prior art sputter source of FIG. 2 and the sputter source of FIG. 1, which is the preferred embodiment of the present invention, will be elucidated below.

From the descriptions thus far, the preferred embodiment of FIG. 1 and the prior art sputter source of FIG. 2 are superficially very similar. One incidental difference is physical size, with, for example, the outer diameter of cathode 12 being approximately 7.00 inches whereas the outer diameter of cathode 112 is approximately 5.15 inches. The significant differences, however, lie in the magnetic field configurations and the magnetic circuits employed to achieve them. The magnetic field configurations in the vicinity of the cathodes are shown in detail in the fragmentary cross sectional views of FIG. 3 for the preferred embodiment and FIG. 4 for the prior art. In these figures, the new or uneroded cathode sputter surfaces are indicated by 13 and 113 respectively, while the end-of-useful-life cathode sputter surface profiles are indicated by 13' and 113'. These profiles were obtained with aluminum cathodes after operation for 400 kilowatt-hours and 148 kilowatt-hours, respectively. Measured magnetic field data are also displayed in FIGS. 3 and 4. In encircled data points 96 in FIG. 3 and 196 in FIG. 4, for example, the local direction of the magnetic field is indicated by the short, heavy line segment, and the magnitude of the magnetic field in gauss at the midpoint of the line segment is indicated by the adjacent number (180 gauss in the instance of encircled data point 96, and 103 gauss in the case of encircled data point 196). Selected magnetic field lines 95 and 195 have been constructed in general conformance with the measured magnetic field data points.

Figure 4:
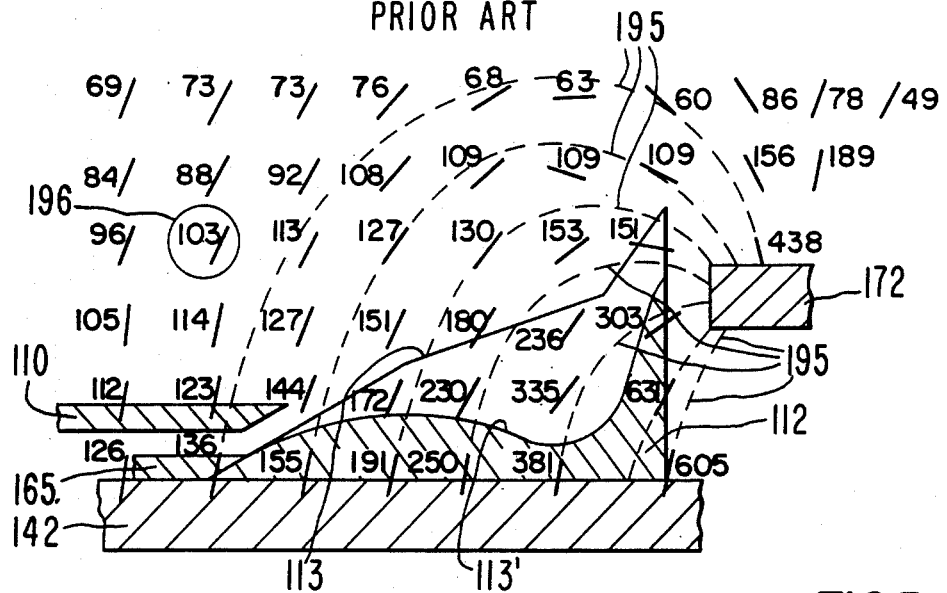
FIG. 4 is a fragmentary section of the prior art sputter source of FIG. 2 showing new and end-of-useful-life cathode profiles and showing also magnetic field lines and data.

In the case of the prior art sputter source of FIG. 4, magnetic field lines 195 which arch through uneroded cathode sputter surface 113 (that is, magnetic field lines which extend from a first region of the cathode sputter surface and return to a second region thereof) form arched field lines along which electrons tend to travel. As the electrons approach the cathode surface they are mirrored or reflected back and are thus retained in a so-called tunnel formed by magnetic field lines which at each end intersect a surface at cathode potential. Such a tunnel can be aptly named a magnetic-electrostatic tunnel. Since the cathode and pole pieces are annular, the magnetic-electrostatic tunnel is a closed loop tunnel and thus retains the electrons which tend to precess in a direction into the paper and would escape from an open ended tunnel. Provided the magnetic field intensities are great enough, such magnetic-electrostatic tunnels serve to confine and magnetically enhance glow discharges.

Figure 3:
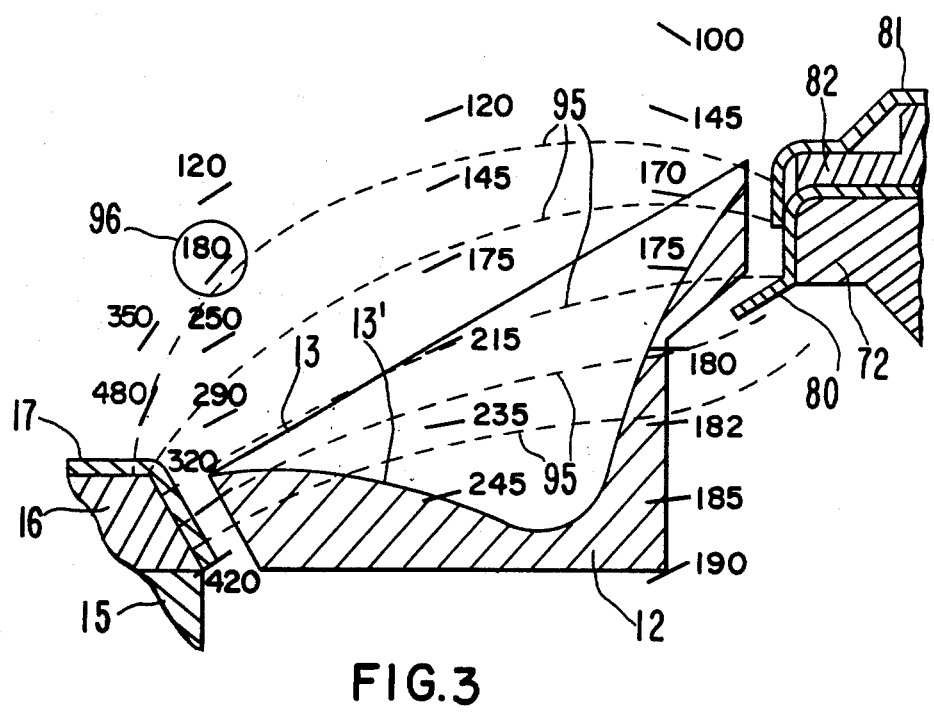
FIG. 3 is a fragmentary section of the sputter source of FIG. 1 showing new and end-of-useful-life cathode profiles and showing also magnetic field lines and data.

In the case of the preferred embodiment of FIG. 3, however, the magnetic field lines which arch above the cathode and which pass hrough uneroded cathode sputter surface 13 do so only once, rather than twice as in the prior art case of FIG. 4. One class of magnetic field lines emanates from outer pole piece 72 and exits cathode sputter surface 13 near the outer diameter of cathode 12; these magnetic field lines do not reenter cathode 12, but rather form an arch from cathode sputter surface 13 to the anode. In normal circumstances, magnetic field lines passing through an electrode held at a positive potential with respect to the cathode provide a ready conduit by which electrons can escape from the discharge. Such magnetic field lines would therefore not be expected to be effective in confining and magnetically enhancing glow discharges. In this particular case, however, care has been taken to ensure that the magnetic field intensity increases sufficiently that an adequate fraction of the electrons is reflected by magnetic mirroring, as will be discussed later. A modified electron capture tunnel is thus realized which is effective in confining and magnetically enchancing glow discharges.

Under conditions of normal operation, the glow discharge is confined by the modified electron capture tunnel above the sputter surface of the cathode. The negative glow region of the discharge, which is where most of the ions are produced by electron-gas atom or electron-gas molecule collisions, is separated from the sputter surface of the cathode by the cathode dark space. The thickness of the cathode dark space is dependent on several parameters, including anode and cathode geometries, magnetic field intensities, cathode material, sputter gas species and pressure, and discharge current. In representative cases, however, the cathode dark space thickness is approximately one millimeter, and the negative glow region of the discharge extends to several millimeters above the sputter surface of the cathode. Beyond these rather general statements, it is not a simple matter to provide a more complete description of the glow discharge on theoretical grounds.

We can, however, make use of cathode erosion patterns to draw certain inferences about the glow discharges. This is so because localized cathode erosion rates correspond generally with the immediately adjacent intensity of the discharge. On this basis it would appear that the situation with prior art sputter sources of FIG. 4 goes about as follows. When cathode 112 is new and the sputter surface is defined by 113, the glow discharge is confined by a relatively wide magnetic tunnel, whereby the discharge extends over most of the cathode sputter surface 113. Even so, discharge intensity will be greater near the center of the magnetic tunnel than near the sides, leading to correspondingly more rapid cathode erosion near the magnetic tunnel center. As cathode erosion proceeds, the discharge is confined by magnetic tunnels of progressively smaller width and larger magnetic field intensities. In addition, the centers of the magnetic tunnels move outward in radial position. By the time end-of-useful-life cathode profile 113' is reached, most of the discharge is concentrated in a relatively narrow ring near the outer edge of cathode 112, and the magnetic field intensity averaged over the discharge may have increased by, perhaps, 100%, or even more.

In the case of the preferred embodiment of FIG. 3, the magnetic tunnels which confine the glow discharge are generally much flatter, that is, much less sharply arching, than the magnetic tunnels of FIG. 4. As cathode erosion proceeds, the center of the magnetic tunnel of FIG. 3 moves radially outward, but less rapidly than the center of the magnetic tunnel of FIG. 4. In addition, the magnetic field intensity averaged over the discharge changes much less rapidly with cathode sputter surface erosion in the case of FIG. 3 than in the case of FIG. 4, the increase by end-of-useful-life being, perhaps, in the 30% to 40% range.

Figure 5A:
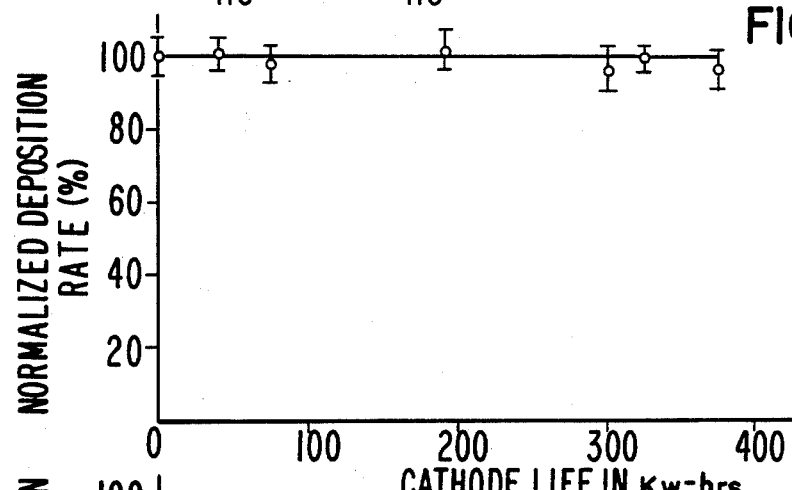
FIGS. 5a and 5b show normalized deposition rates as functions of cathode life in kilowatt-hours for the sputter sources of FIGS. 1 and 2 respectively.
Figure 5B:
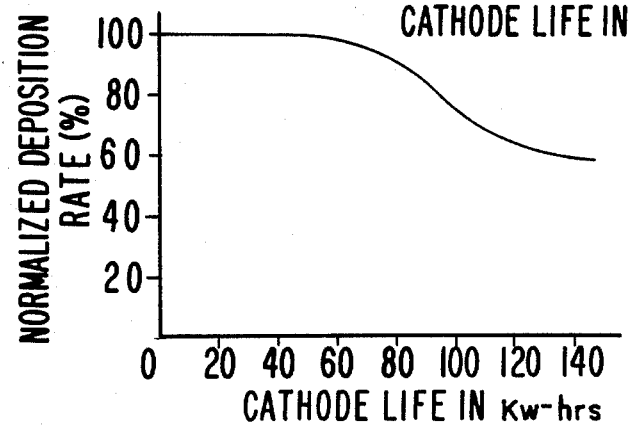

Several consequences result from the significant differences in magnetic field configurations of FIGS. 3 and 4. One of the more important consequences is that the electrical impedance of the glow discharge is higher and changes much less over cathode life in the case of FIG. 3. This in turn means that the operating voltage is higher, and that the voltage and current change correspondingly less at a given discharge power level. At this higher operating voltage, sputter yield increases nearly linearly with voltage. This means that the sputter deposition rate can be held essentially constant throughout cathode life by holding the input power constant when the relatively small changes in discharge impedance do occur. Experimental support for the above statement is provided in FIGS. 5a and 5b in which normalized deposition rates are plotted against cathode life in kilowatt-hours. As shown in FIG. 5a for the preferred embodiment of the present invention, the variation in the normalized deposition rate is less than the ±4% measurement uncertainty over cathode life extending out to 375 kilowatt-hours. By way of comparison, the case for the prior art sputter source of FIGS. 2 and 4 is shown in FIG. 5b, in which the normalized deposition rate has fallen by more than 40% after 140 kilowatt-hours of cathode life. The main reason for this decline in normalized deposition rate is that the discharge impedance has fallen, leading to lower voltage of operation, and, correspondingly, to even lower sputter yield. A second reason is that geometrical shielding by the sputter surface of the cathode itself reduces the deposition rate as the end-of-useful-life cathode sputter surface profile 113' is approached.

In some applications the variation of normalized deposition rate with cathode life leads to serious problems in deposition rate control. One effort to control deposition rate in the face of the variation as shown in FIG. 5b is disclosed in earlier-referenced U.S. Pat. No. 4,166,738 to Turner and entitled "Deposition Rate Regulation by Computer Control of Sputtering Systems". With the substantially constant normalized deposition rate shown in FIG. 5a, a much simpler control system can be used to obtain the desired deposition rate.

Another consequence of the declining normalized deposition rate of FIG. 5b is that input power to the sputter source must be increased if a constant deposition rate is to be maintained. If, for example, the normalized deposition rate has fallen by 40%, it is necessary to increase input power by 67% to obtain the beginning-of-life deposition rate. Thus, more power is consumed; correspondingly, sputter source cooling problems are aggravated; and the power supply must be larger, more flexible, and more expensive than would otherwise be the case. All of these problems are eased substantially with the preferred embodiment of the present invention because of the essentially constant normalized deposition rate shown in FIG. 5a.

Another important consequence of the novel magnetic field configuration of FIG. 3 is that a significantly larger fraction of the cathode material can be utilized than with the prior art sputter source having the magnetic field configuration of FIG. 4. In the case of cathode 12 made of aluminum, the weight of cathode 12 when new, that is, with uneroded cathode sputter surface 13, is 900 grams. After 400 kilowatt-hours of typical operation, end-of-useful-life cathode sputter surface profile 13' has been reached, with a weight loss of 560 grams. Thus, by-end-of-useful-life 62% of the cathode material has been utilized. By contrast, the new weight of prior art cathode 112 is 285 grams, and the end-of-useful-life weight loss is 151 grams after 148 kilowatt-hours, which corresponds to 53% material utilization, Thus the preferred embodiment of the present invention has 17% greater material utilization than the prior art sputter source of FIGS. 2 and 4.

Yet another important consequence of the novel magnetic field configuration of FIG. 3 is that the voltage across the glow discharge is significantly higher than with the prior art sputter source having the conventional magnetic-electrostatic field configuration of FIG. 4. This point is illustrated in FIGS. 6a and 6b by the voltage-current curves taken at various argon pressures. FIG. 6a applies to the preferred embodiment of the present invention as disclosed in FIGS. 1 and 3, while FIG. 6b applies to the prior art sputter source described in FIGS. 2 and 4. For example, with argon as the sputter gas at a pressure of 10 mTorr and at an operating power level of 4.0 kilowatts, the magnitudes of voltage and current from FIG. 5a are about 605 volts and 6.6 amperes, while the voltage and current from FIG. 6b are about 410 volts and 9.8 amperes. The new sputter source thus operates at more than 47% higher voltage than the prior art sputter source in the example given. As the cathodes erode, this difference will become even greater, with the operating voltage of the new sputter source changing by a relatively small amount while the operating voltage of the prior art sputter source is declining to a significantly greater extent (see the earlier discussion relative to FIGS. 5a and 5b). The higher operating voltage of the new sputter source means that it operates at a higher sputter yield, thereby reducing the power required to achieve the desired deposition rate, thus contributing to reductions in costs for power itself, for cooling, and for power supplies.

Further evidence for higher sputtering efficiency with the new sputter source is provided by the earlier paragraph dealing with utilization of cathode material. It was reported there that the cathode weight loss was 560 grams after 400 kilowatt-hours for the new sputter source; this corresponds to an average material removal rate of 1.40 grams per kilowatt-hour. For the prior art sputter source, however, the cathode weight loss was 151 grams after 148 kilowatt-hours, which leads to an average material removal rate of 1.02 grams per kilowatt-hour. The sputtering efficiency for the new sputter source is thus 37% greater than that of the prior art sputter source.

An additional favorable feature of the new sputter source may be noted from FIGS. 6a and 6b. During sputter source operation, it is frequently desirable to maintain constant power in the face of small changes which may occur in sputter gas pressure. For example, with argon as the sputter gas and with an operating power level of 4.0 kilowatts, a change in argon pressure from 4 mTorr to 10 mTorr requires in the case of the new sputter source (FIG. 6a) that the magnitude of the applied voltage change from 740 volts to 610 volts; the voltage change of 130 volts divided by the average voltage of 675 volts is 0.193. With the same power level and argon pressure for the prior art sputter source (FIG. 6b), the required voltage changes from 525 volts to 410 volts; the voltage change of 115 volts divided by the average voltage of 462 volts is 0.249. Thus in this example the fractional voltage change required to maintain constant power is about 22% less for the new sputter source than for the prior art sputter source. This means that the problem of maintaining constant power in the face of sputter gas pressure changes is correspondingly easier with the new sputter source.

It has been stated previously that the objects of the present invention are realized in the preferred embodiment by employing a modified magnetic tunnel in which one side of the magnetic tunnel is formed by a magnetic mirror. In prior art magnetic tunnels, the energetic electrons which sustain the glow discharge are confined by magnetic field lines which arch or loop through the cathode sputter surface. Electrons tend to follow magnetic field lines as they move toward and away from the cathode. Those electrons which have been captured into the discharge are energetically incapable of reaching the cathode. Thus, even though these electrons may follow magnetic field lines toward the cathode sputter surface, they will be electrostatically reflected from the cathode sputter surface back into the discharge. (The incidental presence of magnetic mirroring in prior art magnetic tunnels was discussed briefly in the "Background of the Invention" section of the present application.)

In the preferred embodiment of the present invention, as shown in FIG. 3, the side of the magnetic tunnel near the outer edge of cathode 12 is formed by magnetic field lines which, when the cathode is new, pass through uneroded cathode sputter surface 13. These magnetic field lines do not reenter cathode 12, but instead form an arch from uneroded cathode sputter surface 13 to anode 10. Along the outer side of the magnetic tunnel, electrons are reflected electrostatically from cathode sutter surface 13 back into the glow discharge, just as in the case for both sides of prior art magnetic tunnels. On the inner side of the magnetic tunnel, however, electrostatic forces attract the electrons toward, rather than repelling them from, anode 10. Reflection of an adequate fraction of the electrons is achieved by employing a magnetic field configuration in which the magnetic field intensity increases sufficiently as the electrons approach anode 10. Such a magnetic field configuration is referred to as a magnetic mirror. Thus, a modified magnetic tunnel is formed in which the magnetic field lines (1) cause electrons to be reflected electrostatically, in the usual prior art fashion, near the outer edge of cathode 12, and (2) cause electrons to be reflected by magnetic mirroring near the inner edge of cathode 12.

To better understand how magnetic mirrors function, reference may be made to FIGS. 7a and 7b. FIG. 7a displays schematically a magnetic mirror in which magnetic field lines converge from left to right. FIG. 7b displays, also schematically and on the same scale, the relative magnitude of magnetic field intensity B(z) along some representative magnetic field line. Two representative electron trajectories are shown in FIG. 7a. $v_{\parallel}(Z)$ and $v_{\perp}(Z)$ are, respectively, the parallel and perpendicular components of electron velocity. In the first electron trajectory, at $z=0$, $v_{\parallel}(O)$ is small in comparison with $v_{\perp}(O)$, and electron reflection occurs at $z=z_1$, while in the second electron trajectory, $v_{\parallel}(O)$ is appreciable with respect to $v_{\perp}(O)$, and electron reflection takes place at $z=z_2$. As will be established shortly, $z_2$ is greater than $z_1$. As an electron moves from left to right in a region of increasing magnetic field intensity, $v_{\perp}(Z)$ increases at the expense of $v_{\parallel}(Z)$. Electron reflection occurs where $v_{\parallel}(Z)$ goes to zero; this is the magnetic mirror point. In the absence of an electric field acting on the electrons, conservation of energy of the electrons requires that $$v_{195}(Z_r) = [v_{\perp}^2(O) + v_{\parallel}^2(O)]^{\frac{1}{2}}$$

where $z_r$ is the value of z at which electron reflection occurs.

Also in the absence of an electric field, gyrating electrons tend to conserve their magnetic moment, that is, $$\frac{v_\perp^2(Z_r)}{B(Z_r)} = \frac{v_\perp^2(O)}{B(O)}$$

This relationship combined with the conservation of energy relationship leads to the condition for magnetic mirroring, which may be written as $$\frac{B(Z_r)}{B(O)} = 1 + \frac{v_\parallel^2(O)}{v_\perp^2(O)}$$

or, alternatively, as $$\frac{v_\parallel^{(O)}}{v_\perp^{(O)}} = \left[ \frac{B(Z_r)}{B(O)} - 1 \right]^{\frac{1}{2}}$$

(The following references may be useful in respect to the derivation of the condition for magnetic mirroring: John David Jackson, "Classical Electrodynamics", John Wiley and Sons, Inc., New York, 1962, pp 419–424. Nicholas A. Krall and Alvin W. Trivelpiece, "Principles of Plasma Physics", McGraw Hill Book Company, New York, 1973, pp 622–623. Francis F. Chen, "Introduction to Plasma Physics", Plenum Press, New York, 1974, pp 23–31.)

Examination of the magnetic mirror equations reveals that reflection by a magnetic mirror, unlike electrostatic reflection, is not absolute. Suppose, for example, B(z) approaches a maximum value of 2B(O). All electrons for which $v_\parallel(O)$ is less than $v_\perp(O)$ will be reflected from right to left, while all of those electrons for which $v_\parallel(O)$ is greater than $v_\perp(O)$ will escape to the right. Thus, those electrodes in a glow discharge having $v_\parallel(O)$ greater than $v_\perp(O)$ will be lost from the discharge. It may be useful at this point to define the "strength" of a magnetic mirror as the ratio of the maximum value of B(Z) to B(O). In the example just considered, the strength of the magnetic mirror would be 2.

A second feature of magnetic mirrors revealed by examination of the magnetic mirror equations is that the mirror is "soft" in the sense that the region of electron reflection is not a well-defined physical surface, but depends on the ratio of parallel to perpendicular electron velocities at the interior plane defined by Z=0. For example, if $v_\parallel(O)=0.1v_\perp(O)$, the mirror point will occur at the value of z at which $B(z_r)=1.01B(O)$. Similarly, if $v_\parallel(O)=0.5v_\perp(O)$ electron reflection will occur when $B(z_r)=1.25B(O)$.

In the above treatment of magnetic mirrors it was assumed that no electric fields are acting on the electrons. To the extent that electric fields are present, electron trajectories and points of reflection will be modified.

When voltage is applied to uneroded cathode 12 of FIGS. 1 and 3 without sputter gas being present, a glow discharge will not normally be established, and the electric field distribution in the space above uneroded cathode sputter surface 13 can be estimated or measured by straightforward methods. Upon establishing a glow discharge by introducing a sputter gas, a very different electric field distribution will come into existence. Most of the applied voltage will appear across the cathode dark space adjacent uneroded cathode sputter surface 13. Electric field intensifies in the cathode dark space region will be much greater than in the absence of the glow discharge. The electric field lines will, of course, be normal to uneroded cathode sputter surface 13, and hence will be generally transverse to magnetic field lines 95.

Energetic electrions are essential to sustaining the discharge by giving up their energy through a series of ionizing collisions with sputter gas atoms or molecules. Most of the energetic electrons which are captured into the discharge originate as a result of secondary electron emission from the cathode sputter surface due to positive ion bombardment. These electrons are immediately acted upon by the strong electric field in the cathode dark space, and are accelerated into the negative glow region above the cathode dark space. This leads to electron paths which are generally cycloidal in nature, with the electrons drifting circumferentially above cathode 12 and around central anode 10. The generally transverse nature of the electric and magnetic fields to each other above uneroded cathode sputter surface 13 means that most of the energetic electrons which are captured into the discharge will have velocities which are predominantly perpendicular to rather than parallel with the magnetic field lines, that is, $v_\parallel$ will generally be significantly less than $v_\perp$. Thus these electrons can be confined by a magnetic mirror of modest strength, which is fortunate in view of the crucial role played by these electrons in sustaining the discharge. The main need for a strong magnetic mirror arises from discharge initiation considerations.

The magnetic field data shown in FIG. 3, exemplified by encircled data point 96, reveal that the magnetic field intensity along a representative magnetic field line 95 varies slowly from the point where it exits uneroded cathode sputter surface 13 to the general center of the corresponding modified magnetic tunnel. Near the inner edge of cathode 12, the magnetic field intensity along this magnetic field line has approximately doubled. Thus the magnetic mirror used in the modified magnetic tunnel of the preferred embodiment of the present invention, as shown in FIGS. 1 and 3, has a strength, as defined earlier, of about 2, which is sufficient to reflect back into the glow discharge most electrons for which $v_\parallel$ is less than $v_\perp$. The experimental findings, as described earlier, are that the new sputter source exhibits superior performance in most, if, indeed, not all, significant respects over the prior art sputter source of FIGS. 2 and 4. These results confirm the utility in magnetically enhanced sputter sources of magnetic mirrors in which the mirror strength is on the order of 2.

The demonstrated utility of magnetic mirrors in sputter source provides a new dimension of design freedom. As shown in FIGS. 1 and 3, the magnetic circuit has been configured to produce magnetic field lines which are substantially parallel to uneroded cathode sputter surface 13 over most of its extent. This is in sharp contrast to the prior art sputter sources in which the magnetic field lines exit and reenter the cathode sputter surface, forming relatively narrow arches over the cathode, as shown, for example, in FIGS. 2 and 4. Because the magnetic field lines in FIG. 3 are substantially parallel to uneroded cathode sputter surface 13, the glow discharge is more spread out and more uniform in intensity than in prior art sputter sources employing conventional magnetic tunnels. Moreover, the intrinsic softness of the magnetic mirror allows the glow discharge to extend radially inward farther than would be the case for the electrostatic reflection which dominates in conventional magnetic tunnels. Finally, the use of a magnetic mirror has made it feasible to reduce the change in magnetic field intensity averaged over the glow discharge as the cathode is eroded away by sputtering. These just-mentioned factors are in large measure responsible for the superior sputter source performance described earlier.

Realization of a magnetic mirror is accomplished by so configuring the magnetic circuit that the magnetic field lines converge. Suppose, for example, that field lines passing through transversely oriented area $A_0$ in the central region of the glow discharge, and that these same magnetic field lines pass through transversely oriented area $A_a$ adjacent the anode. If $B_o$ is the average intensity of the magnetic field lines passing through $A_o$, then the average magnetic field intensity adjacent the anode, $B_a$, is $$B_a = \frac{A_o}{A_a} B_o,$$

and the strength of the magnetic mirror, as defined previously, is just magnetic mirror strength $$\equiv \frac{B_a}{B_o} = \frac{A_o}{A_a}.$$

In the preferred embodiment of the present invention as shown in FIGS. 1 and 3, the magnetic field lines appear to converge by a factor of approximately 1.6 in the transverse plane of FIG. 3 in going from the central region of the glow discharge to the inner edge of cathode 12. In addition, these magnetic field lines converge further by the radial convergence factor, which is the effective radial distance to the central region of the glow discharge divided by the inner radius of cathode 12. This radial convergence factor may be taken to be about 1.4, leading to a magnetic mirror strength of approximately $1.6 \times 1.4 = 2.2$.

Much of the discussion concerning the modified magnetic tunnels of the present invention has been restricted to the situation in which cathode 12 is new, and hence uneroded. In this configuration, the side of the magnetic tunnel near the outer edge of cathode 12 is formed by magnetic field lines which pass through uneroded cathode sputter surface 13. These magnetic field lines do not reenter cathode 12, but instead form an arch to anode 10. Along the outer side of the magnetic tunnel, electrons are reflected electrostatically from cathode sputter surface 13 back into the glow discharge. On the inner side of the magnetic tunnel, electrons are reflected back into the discharge by magnetic mirroring.

In normal operation the cathode is eroded away by sputtering. After about 400 kilowatt-hours of normal operation with an aluminum cathode, the end-of-useful-life cathode sputter surface profile 113' has been attained. With this eroded configuration, some of the magnetic field lines which exit cathode sputter surface 13' near the outer edge now reenter this surface en route to anode 10. It is likely that by end-of-useful-life the discharge is confined by a magnetic tunnel in which electrons are reflected largely electrostatically along the inner side of the tunnel, as well as along the outer side, rather than being reflected by magnetic mirroring as they were when the cathode was new. It is believed that this conversion from a soft magnetic mirror to a hard electrostatic mirror causes the glow discharge to become more concentrated in a narrower ring toward the outer edge of cathode 12, leading to comparatively rapid erosion in that region as end-of-useful-life approaches. Based on experimentally observed evolution of cathode sputter surface profiles with operation, it is believed that this change in the mode of reflection occurs near the end-of-useful-life cathode. As noted earlier, the glow discharge normally extends several millimeters above the cathode. Hence, the magnetic field which is effective in confining the glow discharge is a field averaged in some fashion over the discharge rather than being just the field averaged over the cathode sputter surface.

The fact that a transition from magnetic mirror reflection to electrostatic reflection occurs reduces erosion near the inner edge of cathode 12; it also hastens end-of-useful-life by concentrating the discharge in a narrower ring toward the outer edge of cathode 12. While it would be preferable to avoid this change in mode of reflection altogether, the fact remains that greatly improved sputter source performance is achieved with the preferred embodiment of the present invention, as shown in FIGS. 1 and 3, over prior art sputter sources such as the one shown in FIGS. 2 and 4. As discussed earlier, this is due in large measure to the new dimension of design freedom which the use of magnetic mirrors allows.

While the invention has been described with reference to specific arrangements of parts, the description is illustrative of the invention and is not to be construed as limiting the invention. Various modifications and applications may occur to those skilled in the art without departing from the true spirit and scope of the invention as defined by the appended claims.

I claim:

1. Glow discharge sputter coating apparatus comprising:
    cathode means including an annular sputter target having a surface from which material is to be sputtered and an inner and an outer rim each intersecting said sputter surface;
    a magnetic system including magnetic poles, said poles comprising an inner pole adjacent said inner rim of the target, and an outer pole adjacent said outer rim of the target, said poles being of opposite magnetic polarity for producing a magnetic field comprising field lines which pass from the inner pole over the adjacent portion of said sputter surface without first intersecting said sputter surface and then intersect said sputter surface toward the outer pole;
    said inner magnetic pole being electrically insulated from said cathode means whereby said inner magnetic pole can be operated at positive potential relative to said cathode means; and
    the configuration and location of said magnetic poles being such that the magnetic field intensity increases toward said inner pole from a region between said poles to form a magnetic mirror to confine electrons in the magnetic field adjacent said inner pole in an amount sufficient to provide said glow discharge when said inner pole is at a positive potential with respect to said cathode means.

2. Glow discharge sputter coating apparatus as claimed in claim 1 comprising means for operating said inner pole at sufficiently positive potential to form an anode for said apparatus.

3. Glow discharge sputter coating apparatus as claimed in claim 2 wherein said outer pole is electrically insulated from said cathode means whereby said outer pole can be operated at positive electrical potential relative to said cathode means to avoid sputtering from the outer pole.

4. Glow discharge sputter coating apparatus as claimed in claim 1 wherein said sputter surface is in the form of an inverted generally conical surface.

5. Glow discharge sputter coating apparatus as claimed in claim 4 wherein said target has a bottom surface opposite said generally conical surface, said outer rim intersects said bottom surface and said generally conical surface, said outer rim having a lower portion intersecting said bottom surface and an upper portion intersecting said generally conical surface, said upper portion being of larger diameter than said lower portion, and a cooling jacket surrounding said lower portion and shielded by said upper portion.

6. Glow discharge sputter coating apparatus as claimed in claim 5 wherein said inner rim includes a recess having a clamping surface sloping inwardly and downwardly toward said bottom surface, and clamping means for engaging said clamping surface.

7. Glow discharge sputter coating apparatus as claimed in claim 4 wherein said outer pole is an annular member surrounding said sputter target, and the top of said inner pole is below the top of said outer pole.

8. Glow discharge sputter coating apparatus as claimed in claim 1 wherein said annular sputter target has a cross sectional shape wherein the inner rim is sloped outwardly from its intersection with said sputter surface, said inner pole has an outer edge received within said inner rim of said target, and said outer edge of said inner pole has a slope generally matching the slope of said inner rim of said target.

9. Glow discharge sputter coating apparatus as claimed in claim 8 wherein said inner pole has a removable peripheral ring portion adjacent said inner rim of said sputter target.

10. Glow discharge sputter coating apparatus as claimed in claim 1 wherein said magnetic system comprises a permanent magnet and an electromagnet coil, whereby the strength of the magnetic field can be adjusted by adjusting the current flowing in said electromagnet coil.

11. Glow discharge sputter coating apparatus as claimed in claim 1 wherein said magnetic system includes centrally located magnet means concentric with said inner pole, an outer cylinder of magnetic material magnetically joined to said outer pole, and a plate of magnetic material forming a magnetic circuit between said magnet means and said outer cylinder.

12. Glow discharge sputter coating apparatus as claimed in claim 1 wherein the magnetic field intensity at said inner pole is greater than the magnetic field intensity at said region of the magnetic field by a factor of at least about 2.

13. Glow discharge apparatus as claimed in claim 1 wherein said outer pole is electrically insulated from said cathode means and adapted to operate at the same potential as said inner pole.

14. Glow discharge sputter coating apparatus comprising:
cathode means including an annular sputter target having a surface from which material is to be sputtered and inner and outer rims each intersecting said surface;
anode means positioned within the area surrounded by said target with the outer perimeter of said anode means being located adjacent said inner rim of the target;
said anode means being insulated from said cathode means and being adapted to operate at positive potential relative to said cathode means to provide the electrical field for the glow discharge;
a magnetic system comprising magnet means and an outer pole located adjacent said outer rim of the target, and said anode means comprising magnetic material forming an inner pole; said outer and inner poles being of opposite magnetic polarity for establishing a magnetic field over said sputter surface; and
the configuration and location of said magnetic poles being such that the magnetic field intensity increases from a region between said poles to a position adjacent said inner pole sufficiently to form a magnetic mirror to confine electrons in the magnetic field at the inner pole side of the magnetic field in an amount sufficient to provide said glow discharge.

15. Glow discharge sputter coating apparatus comprising:
cathode means comprising an annular sputter target having a surface from which coating material is to be sputtered and inner and outer rims each intersecting said sputter surface;
a magnet system including inner and outer magnetic poles positioned respectively adjacent said inner and outer rims, said poles being of opposite magnetic polarity for producing a magnetic field having field lines which pass between said poles over at least a portion of said sputter surface;
said inner pole being electrically insulated from said cathode means, whereby said inner pole is adapted to be operated at a positive potential relative to said cathode means;
the configuration and location of said magnetic poles being such that the magnetic field intensity increases toward said inner pole from a region between said poles sufficiently to form a magnetic mirror to confine electrons in the magnetic field adjacent said inner pole in an amount sufficient to provide said glow discharge when said inner pole is at a positive potential relative to said cathode means; and
said inner pole being positioned with respect to said target, such that said inner pole extends above the inward projection of a line interconnecting said intersections of said inner and outer rims with said sputter surface.

16. Glow discharge sputter coating apparatus comprising:
an annular outer shell of magnetic material;
magnetic field forming means comprising magnet means centrally located within said shell and magnetically connected to said shell through means of magnetic material;
annular cathode means substantially concentric with said shell and positioned inside said shell, said cathode means having radially inner and outer rims;
an outer magnetic pole formed adjacent the end of said shell remote from said means of magnetic material and positioned adjacent said outer rim;
an inner magnetic pole adjacent said inner rim and of opposite polarity from said outer pole, said inner pole being formed by said centrally located magnet means; and said inner pole being electrically insulated from said cathode means and adapted to form an anode for the glow discharge.

17. Glow discharge apparatus as claimed in claim 16 further comprising hermetic sealing means between said magnet means and said cathode means, whereby said magnet means can be at atmospheric pressure when said cathode means are in an evacuated chamber.

18. Glow discharge sputter coating apparatus employing magnetic mirroring to confine electrons, said apparatus comprising:

cathode means including a sputter target having a surface from which material is to be sputtered;

a magnetic system including two magnetic poles of opposite polarity positioned to form fringing magnetic field lines therebetween, at least some of said field lines having a central region passing over said sputter surface, and opposite end portions curving in the general direction of said sputter surface adjacent said two poles;

said poles being positioned with respect to said sputter surface and each other such that at least some of the magnetic field lines pass from one pole over said sputter surface in a direction toward the other pole without first passing through said sputter surface;

said one pole being electrically insulated from said cathode means and adapted to be operated at positive electrical potential relative to said cathode means to provide an anode for said sputter coating apparatus; and said magnetic system being such that the intensity of said magnetic field lines adjacent said one pole is substantially greater than in a generally central region between said poles and by an amount which forms a magnetic mirror to confine electrons in the magnetic field adjacent said one pole in an amount sufficient to provide said glow discharge when said one pole is at positive potential relative to said cathode means.

19. Glow discharge sputter coating apparatus as claimed in claim 18 wherein the magnet field intensity adjacent said one pole is greater than the magnetic field intensity at said generally central portion of the magnetic field by a factor of at least about two.

20. Glow discarge sputter coating apparatus as claimed in claim 18 wherein both of said poles are electrically insulated from said cathode means.

21. Glow discharge sputter coating apparatus as claimed in claim 18 wherein the poles of said magnetic system consist entirely of said two poles.

22. Glow discharge sputter coating apparatus as claimed in claim 18 wherein said magnetic field is such that after the sputter surface has been eroded by ions in the glow discharge, some magnetic field lines passing from said one pole toward said other pole pass first through said target and then exit from said eroded surface.

23. Glow discharge sputter coating apparatus comprising:

annular cathode means adapted to be operated at cathode potential;

a magnetic system forming two magnetic pole means of opposite priority for forming a magnetic field passing between said pole means;

one of said pole means being positioned inwardly of said annular cathode means, and the other of said pole means being positioned outwardly of said annular cathode means;

the location of said pole means relative to said cathode means being such that at least some fringing magnetic field lines pass across said cathode means in a closed loop annular configuration; and both said pole means being electrically insulated from said cathode means and adapted to be operated at a positive electrical potential relative to said cathode means, whereby said pole means can provide an anode potential for said glow discharge, and whereby sputtering from both of said pole means is prevented when said pole means are operated at positive electrical potential relative to said cathode means.

24. Glow discharge sputter coating apparatus comprising:

cathode means comprising an annular sputter target having a surface from which coating material is to be sputtered and inner and outer rims each intersecting said sputter surface;

a magnet system including inner and outer magnetic poles positioned respectively adjacent said inner and outer rims, said poles being of opposite magnetic polarity for producing a magnetic field having field lines which pass between said poles over at least a portion of said sputter surface;

said inner pole being electrically insulated from said cathode means, whereby said inner pole is adapted to be operated at a positive potential relative to said cathode means;

said inner rim of the sputter target being sloped outwardly from its intersection with said sputter surface; and said inner pole having a slope adjacent to and substantially matching said slope of said inner rim of the sputter target.

* * * * *